United States Patent [19]
Lau et al.

[11] Patent Number: 5,493,672
[45] Date of Patent: Feb. 20, 1996

[54] CONCURRENT SIMULATION OF HOST SYSTEM AT INSTRUCTION LEVEL AND INPUT/OUTPUT SYSTEM AT LOGIC LEVEL WITH TWO-WAY COMMUNICATION DEADLOCK RESOLUTION

[75] Inventors: Manpop A. Lau, Sunnyvale; Loran Ball, Campbell; Raju Joshi, Sunnyvale, all of Calif.

[73] Assignee: Sun Microsystems, Inc., Mountain View, Calif.

[21] Appl. No.: 245,201

[22] Filed: May 16, 1994

[51] Int. Cl.$^6$ ........................................... G06F 13/14
[52] U.S. Cl. .................. 395/500; 395/827; 364/578; 364/DIG. 1; 364/242.6; 364/242.3; 364/802
[58] Field of Search .................................... 364/578, 802; 395/500

[56] References Cited

U.S. PATENT DOCUMENTS 4,918,594  4/1990  Onizuka ................................... 395/500
5,126,966  6/1992  Hafeman et al. ........................ 395/500
5,134,705  7/1992  Smith et al. ............................. 395/700

*Primary Examiner*—Ken S. Kim
*Attorney, Agent, or Firm*—Blakely Sokoloff Taylor & Zafman

[57] ABSTRACT

A method and apparatus is provided for integrating a logic level simulation with an instruction level simulation for more accurate and faster system level simulation for testing. A host system or processors (CPU) is simulated by the instruction level simulator and the simulation of an input/output subsystem is modeled by the logic level simulator. The two simulations work side by side communicating through an interprocess communication (IPC) device and both simulations can perform a read/write access. Hence, a DMA and a slave access can occur at the same time causing a deadlock situation where both simulators are waiting for data and acknowledgment from each other at the same time. An input/output subsystem SBus module resolves this deadlock by deferring the non-DMA transaction. Finally, the synchronization of the two simulations is handled by the invention allowing the two simulators to run as asynchronous peers.

18 Claims, 8 Drawing Sheets

CONCURRENT SIMULATION OF HOST SYSTEM AT INSTRUCTION LEVEL AND INPUT/OUTPUT SYSTEM AT LOGIC LEVEL WITH TWO-WAY COMMUNICATION DEADLOCK RESOLUTION

BACKGROUND OF THE INVENTION (1) Field of the Invention

The present invention relates to the field of system level simulation. More particularly, the present invention relates to a method and apparatus for system level simulation through integration of a logic level simulator with an instruction level simulator.

(2) Background of the Invention

In the past, simulation of an entire system, i.e. all the components of the motherboard including the processor, has been accomplished by building hardware prototypes using wire wrapping and other bread-boarding techniques. Testing of software was conducted using such prototypes. Unfortunately, prototyping using wire wrapping and other breadboarding techniques typically is not conducive to handling the speed and density of high performance system simulations. Given a printed circuit board as the first prototype, debugging an assembled circuit board often requires building a new board, and hence is time consuming.

An improvement in prototyping practices for system level simulation includes hardware simulation in an environment where real software is allowed to interact with the simulated hardware. In this hardware simulation environment, a mixed-level logic simulator is used to model the processor, the system and the input/output devices at the Register transfer level (RTL)/Gate Level. Unfortunately, simulation of the CPU requires increased simulation cycles. In addition, prior art described in an article from the 29th ACM/IEEE Design Automation Conference, titled "An Engineering Environment for Hardware/Software Co-Simulation" by David Becker, et al., using a logic level simulator combined with real software for simulated is a slave device. Further, direct memory access system level simulation assumes that the hardware being (DMA) is not supported by such prior art.

Simulation of system software such as device drivers and diagnostic programs is accomplished by system simulators for simulating the processor and the system. Prior art system level simulation methods have used an instruction level simulator which models a high level programmer's view of the system. An instruction level simulator runs faster than the logic level simulator but may not be able to model input/output devices accurately.

In sum, instruction level simulators are not able to model input/output devices accurately, and logic level simulators are too slow due to the overhead caused by simulation of the processor and the system. In addition, prototyping for system level simulation is a time-consuming and difficult process. Thus, there is a need for an apparatus and method for integrating an instruction level simulator with a logic level simulator which takes advantage of the accuracy of the logic level simulator as well as high performance of the instruction level simulator, thereby increasing both accuracy and speed of simulation time for system level simulation. Further, an integrated simulator decreases the need for debugging or rebuilding prototypes for system level simulation and testing and hence decreases conception to market turnaround time.

BRIEF SUMMARY OF THE INVENTION

A method and apparatus are provided for integrating a logic level simulation with an instruction level simulation for more accurate and faster system level simulation. An instruction level simulator simulating system software such as device drivers and diagnostic programs is typically an instruction accurate simulator. Although an instruction level simulator runs faster than a logic level simulator (~10,000 times faster), the instruction level simulator does not model input/output devices accurately. A logic level simulator is typically used to model a processor, a system and input/output devices at the RTL/Gate Level and are very accurate but are typically slow due to the overhead of increased simulation cycles for simulating a processor in a system.

In order to take advantage of the speed provided by an instruction level simulator, and the accuracy provided by a logic level simulator, the two types of simulations are integrated to produce a faster, more accurate system level simulation.

In a preferred embodiment, the logic level simulation of a processor is replaced with a simulation of a host system simulated by MPSAS®, an instruction level simulator. Further, the simulation of an input/output subsystem is modeled by Verilog XL®, a logic level simulator. The two simulations work side by side communicating through an interprocess communication (IPC) device. Dedicated modules are provided for both simulations which are responsible for sending or receiving messages between simulations. On the instruction level simulator side, a host system sends and receives messages from the host system to the simulated input/output subsystem. Similarly, on the logic level simulation side, an input/output subsystem is responsible for sending and receiving messages from an application specific integrated circuit (ASIC) or a custom integrated circuit under test to the host system. The input/output subsystem supports the functions of arbiter, master and slave, and resolves deadlock situations between two simulators.

The integrated simulator of the invention supports both slave and direct memory access (DMA). Both the logic level and instruction level simulations can make master and slave accesses at any given point in time. As such, a DMA and a slave access can occur at the same time causing a deadlock situation where both simulators are waiting for data and acknowledgment from each other at the same time. The input/output subsystem resolves this deadlock by deferring the non-DMA transaction on the logic level simulation side. The instruction level simulator is only event dependent and the logic level simulator is time dependent. The synchronization of these two types of simulators is resolved allowing the two simulators to run as asynchronous peers.

In sum, the integration of an instruction level simulator with a logic level simulator allows for accurate simulation of input/output devices by using the logic level simulator to model an input/output subsystem and utilizing the instruction level simulator to simulate a host system or processor (CPU). Such integration produces an overall fast and more accurate system level simulation and decreases the time consumed in debugging prototypes, thereby allowing for a faster conception to first working prototype turnaround.

DETAILED DESCRIPTION OF THE INVENTION

Apparatus and methods for system level simulation and testing using an integration of an instruction level simulator with a logic level simulator are disclosed.

In the following description, for purposes of explanation, specific modules, etc., are set forth in order to provide a thorough understanding of the present invention. However, it will be apparent to one skilled in the art that the present invention may be practiced without these specific details. In other instances, well-known circuits and devices are shown in block diagram form in order not to obscure the present invention unnecessarily.

Figure 1:
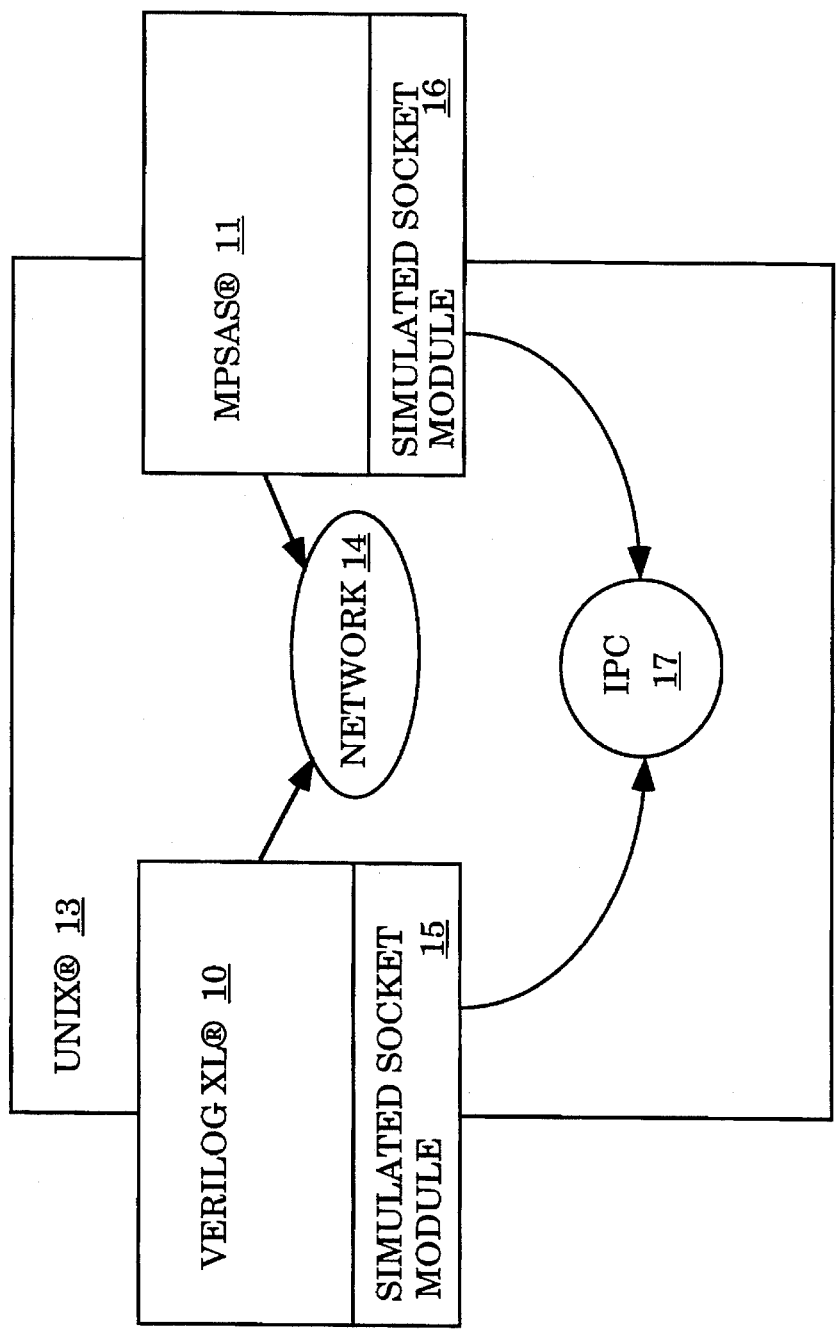
FIG. 1 illustrates an exemplary co-simulation environment of the present invention.

FIG. 1 illustrates an exemplary co-simulation environment of the present invention used to simulate and test a system. The co-simulation environment is composed of MPSAS® 10, an instruction level simulator program, and Verilog XL® 11, a logic level simulator program, both running on UNIX® 13. To begin a co-simulation, Verilog XL® 11 running on UNIX® 13 performs a command to open a socket (an address) on UNIX® 13, and waits to be linked with MPSAS® 10. Subsequently, MPSAS® 10 is initiated across network 14 and begins running on UNIX® 13. MPSAS® 10 is then linked to Verilog XL® 11 through the socket opened on UNIX® 13. Once MPSAS® 10 and Verilog XL® 11 are linked across network 14, MPSAS® 10 and Verilog XL® 11 begin to simulate a system as requested by a user utilizing the co-simulation for testing. Message packets which are sent between the MPSAS® simulated portions and the Verilog XL® simulated portions are transmitted by socket modules 15 and 16 through UNIX® IPC. (interprocess communication) 17.

Figure 2:
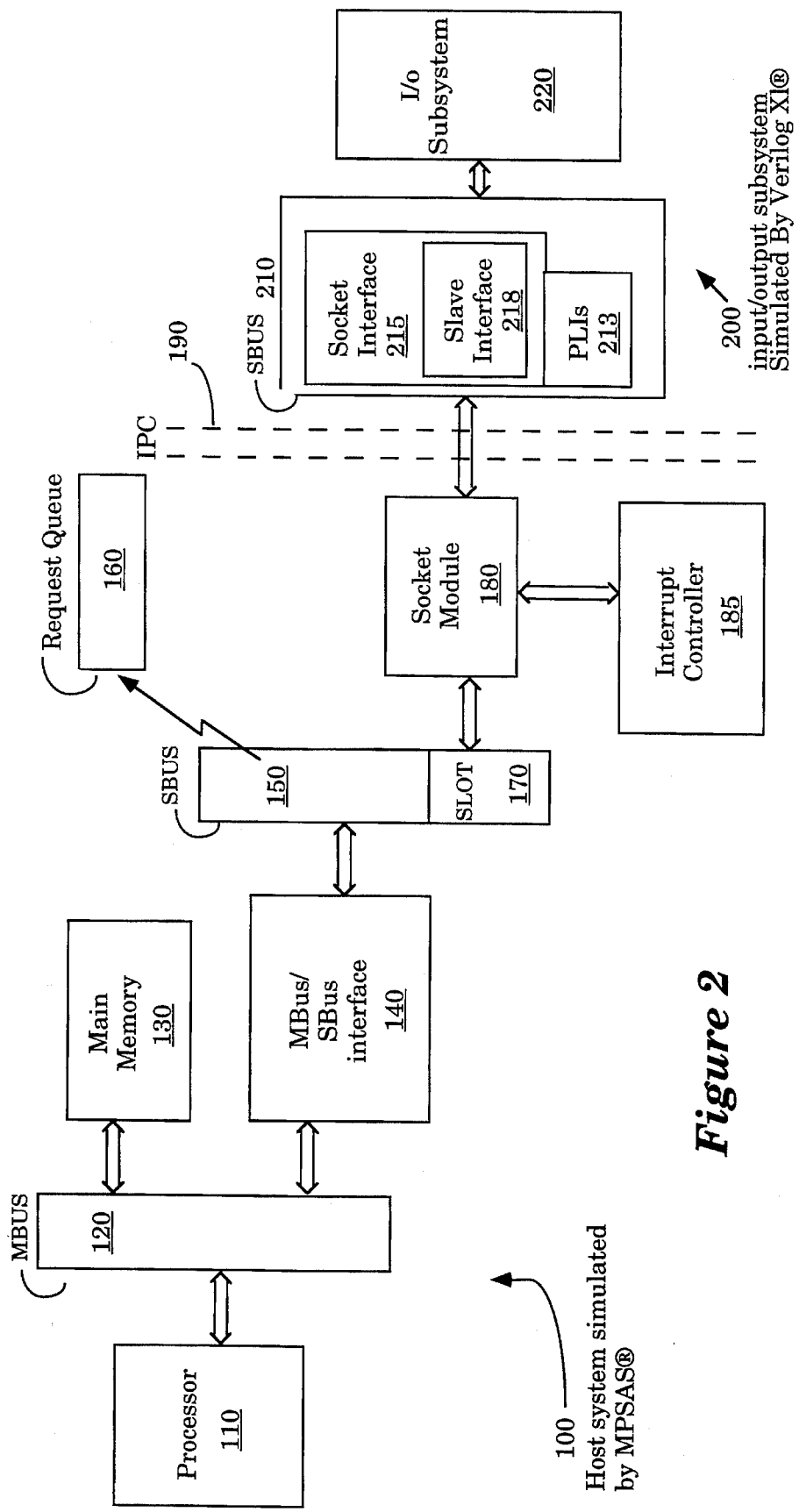
FIG. 2 illustrates an exemplary simulation of a host system simulated by MPSAS® and an I/O subsystem simulated by Verilog XL® in the co-simulation environment of FIG. 1.

FIG. 2 is a block diagram of an exemplary integrated system level simulation of the present invention. The integrated system level simulation is of a concurrently active host system simulated by MPSAS® and an input/output subsystem simulated by Verilog XL® used to test the simulated input/output subsystem.

Portion 100 is a host system simulated by MPSAS®. This host system 100 comprises processor 110, MBus module 120 which interfaces processor 110 with main memory 130 and MBus/SBus interface 140, host system SBus module 150 which prioritizes read accesses in request queue 160, and slot 170 which indicates what process has a read access priority, socket module 180 and interrupt controller module 185. Portion 200 is an input/output subsystem simulated by Verilog XL® and is composed of I/O subsystem module 220 and I/O SBus module 210.

Socket modules on both simulations are responsible for sending and receiving messages between the respective simulations. Socket module 180 sends and receives message packets from simulated host system 100 to simulated I/O subsystem 200. On the I/O subsystem 200 side, I/O subsystem SBus module 210 comprising socket interface 215, PLI tasks 213, and SBus interface 218 sends and receives message packets from an application specific integrated circuit (ASIC) under test to host system 100.

The bus transactions can be represented by messages as is well known in the art. Two types of messages are required to represent a master/slave operation and an interrupt operation. Both message types, master/slave and interrupt operations, have two types of packets associated with each message. Each message is started with a header packet (herein referred to as a "socket_pkt") which specifies the format of data being transmitted over a communication channel (depicted by interprocess communication (IPC) 190 in FIG. 2). The message is then ended with the specific transaction packet, which in the case of a master/slave operation is a gen_bus_pkt which contains the data and other information defining the read/write operations. A transaction packet for the interrupt operation consists of a gen_int_pkt, which is used to signal level-sensitive interrupts.

In an alternate embodiment, Verilog XL®, the logic Level simulator simulates the memory processor bus depicted by MBus/SBus interface 140 and the portions to the right thereof, in addition to simulating I/O subsystem module 220 and I/O SBus module 210. Further, MPSAS®, the instruction level simulator simulates only the processor.

Figure 3:
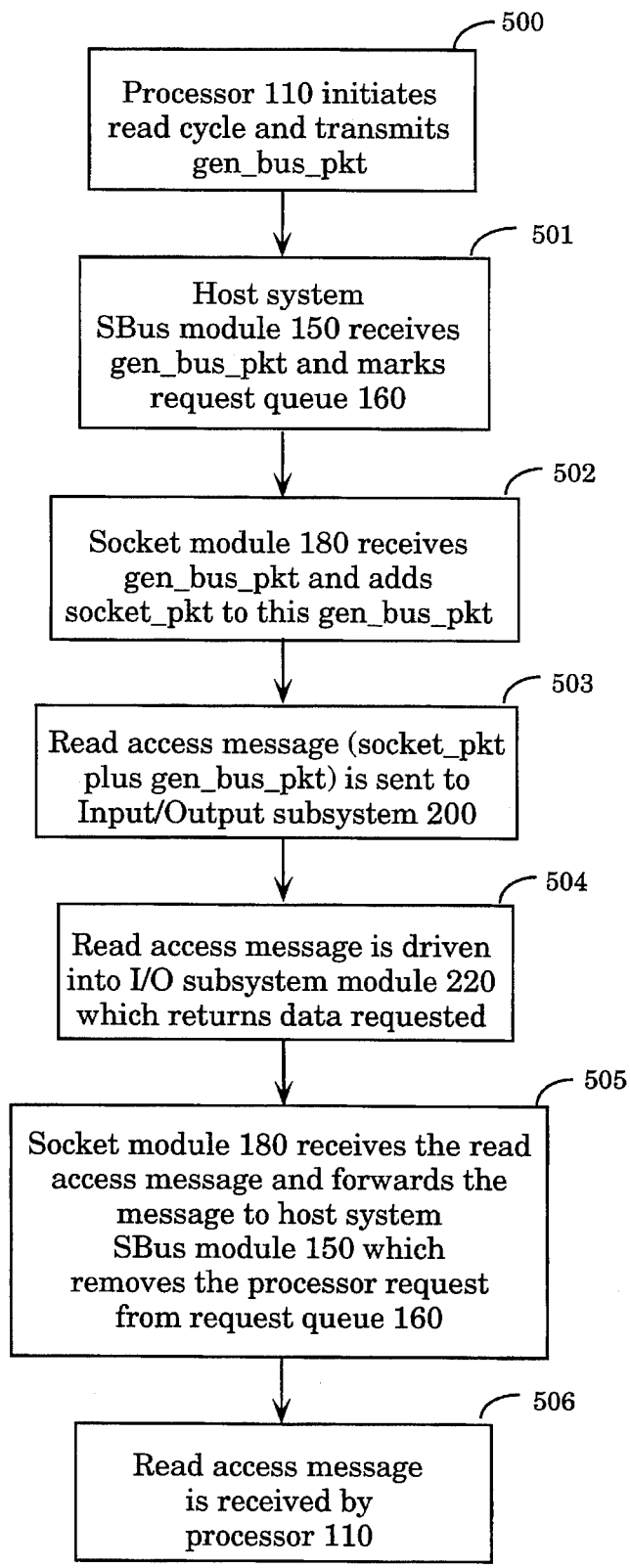
FIG. 3 is a flow chart of processor input/output read events for the simulation of FIG. 2.

FIG. 3 is a flow chart of a processor input/output read operation using the co-simulation environment of the present invention. This flow chart will be described with references to the components of the block diagram in FIG. 1. In block 500, processor 110 initiates a read cycle transaction by transmitting a gen_bus_pkt containing the memory address to be read, the size of the transaction to be completed, and the read mode information to MBus module 120. MBus module 120 receives the gen_bus_pkt and forwards the request to MBus/SBus interface 140 which then forwards the gen_bus_pkt to the host system SBus module 150. In block 501, upon receiving the gen_bus_pkt, host system SBus module 150 marks the request queue 160 to indicate that the processor 110 has made a read request to access the device in slot 170. The host system SBus 150 then forwards the gen_bus_pkt to socket module 180.

In block 502, upon receiving the gen_bus_pkt, socket module 180 adds a socket_pkt onto the gen_bus_pkt of the message to produce a master/slave message. Socket_pkt carries information such as a packet originating identifier (in this case, MBus module 120), the type of transaction packet following the socket_pkt (in this case, gen_bus_pkt) and the size of the transaction packet. In block 503, socket module 180 sends the message (socket_pkt plus gen_bus_pkt) via interprocess communication (IPC) 190 to I/O subsystem 200. Processor 110 then enters into an idle state and waits for an acknowledgment from I/O subsystem 200. I/O subsystem SBus module 210 receives the message through socket interface 215 sends the message to PLI task 213 of I/O subsystem SBus module 210 which checks for a deadlock. (The deadlock situation and resolution of the deadlock situation will be explained in more detail in the subsequent description regarding DMA/master and slave operations.)

In block 504, socket interface 215 of I/O subsystem SBus module 210 initiates an I/O subsystem SBus driver routine.

The read access message is then driven into an I/O subsystem module 220 which in turn responds to the request and returns the data and a good acknowledgment. The SBus interface 218 in the I/O subsystem SBus module 210 latches data returned by I/O subsystem module 220 and passes the data to PLI task 213 within I/O subsystem SBus module 210. PLI task 213 appends the data to the incoming header packet and sets a good acknowledgment flag in the message containing the data in the header packet. I/O subsystem module then sends the message to the host system 100.

In block 505, socket module 180 receives the message and forwards the message to host system SBus module 150. Upon receiving the message, host system SBus module 150 removes the processor request from request queue 160 and forwards the message to MBus/SBus interface 140. In block 506, MBus/SBus interface 140 forwards the message to MBus module 120 which, in turn, forwards the message to processor 110 and the processor read access is completed. A write cycle request by processor 110 is performed in the same way as the afore-described read cycle request, and upon completion of a write cycle request by processor 110, processor 110 will receive a return message for the good acknowledgment flag.

Figure 4:
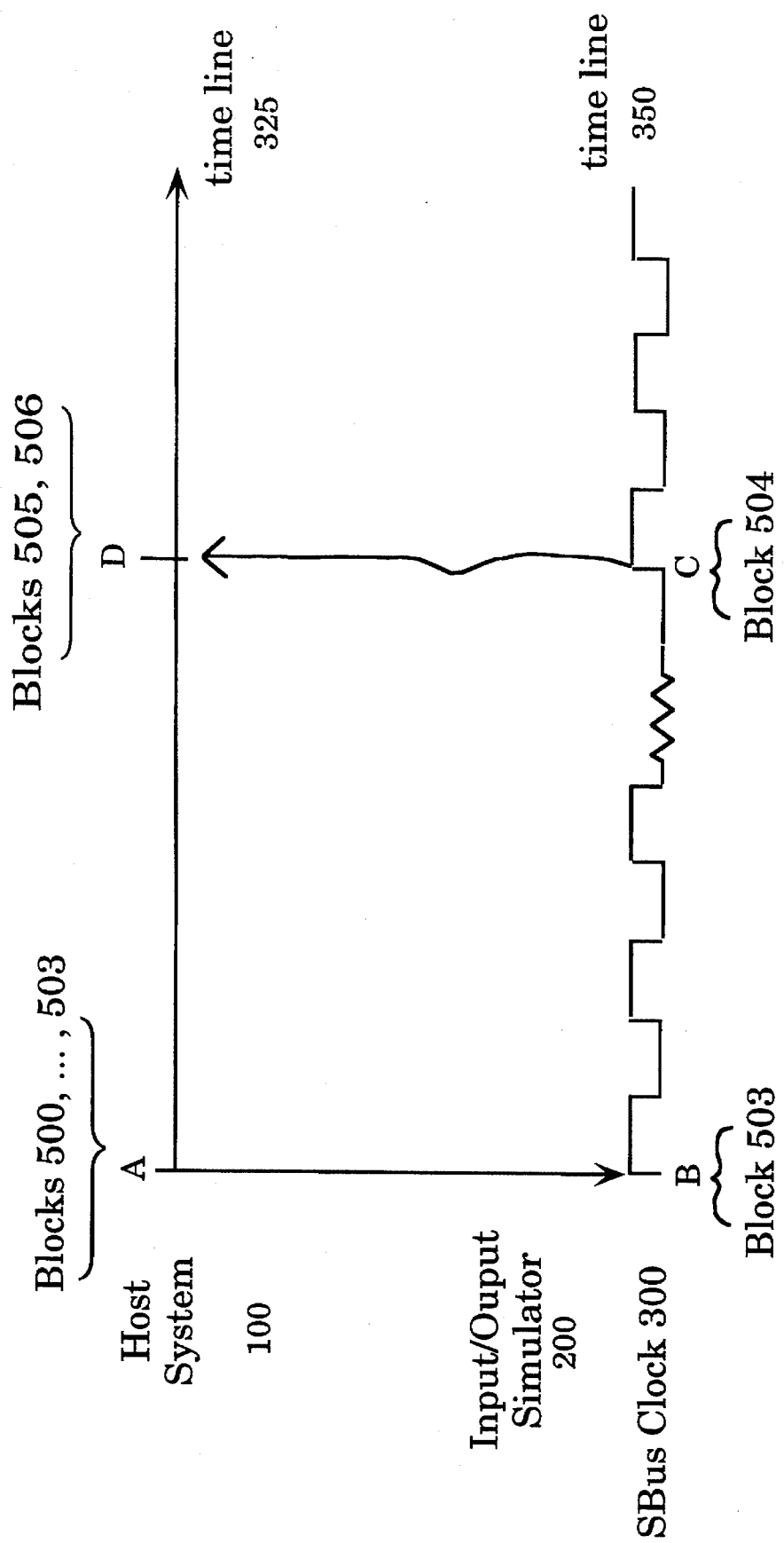
FIG. 4 is a timing diagram depicting processor input/output read events for the simulation of FIG. 2.

The timing diagram of FIG. 4 depicts the afore-described processor input/output read events of a master/slave operation. FIG. 4 also illustrates how the event driven instruction level simulator and the time driven logic level simulator are synchronized. Time lines 325 and 350 depict sequences of events occurring at indicated points in time. Both time lines, the time line 325 for host system 100 and the time line 350 for I/O subsystem 200, are marked with times A, D and B, C, respectively, and with blocks 500 through 506 from the flow chart of FIG. 3 to indicate events occurring at times A, B, C, and D. I/O subsystem 200 time line 350 is depicted by clock pulses of I/O subsystem SBus clock 300.

At time A, socket module 180 of host system 100 sends the read access message as afore-described to I/O subsystem 200 and host system 100 enters a wait state while it waits for a return message from I/O subsystem 200. At point B, socket interface 215 of I/O subsystem SBus module 210 receives the read message, checks for deadlock, processes the information, and when the read is completed, the socket interface 215 appends the data read to the message and sets a good acknowledgment flag to the message and sends it back to host system 100. At point C, I/O subsystem 200 enters an idle state and at point D socket module 180 of host system 100 forwards the message to host system SBus module 150 after which the message eventually gets forwarded to processor 110.

Figure 5:
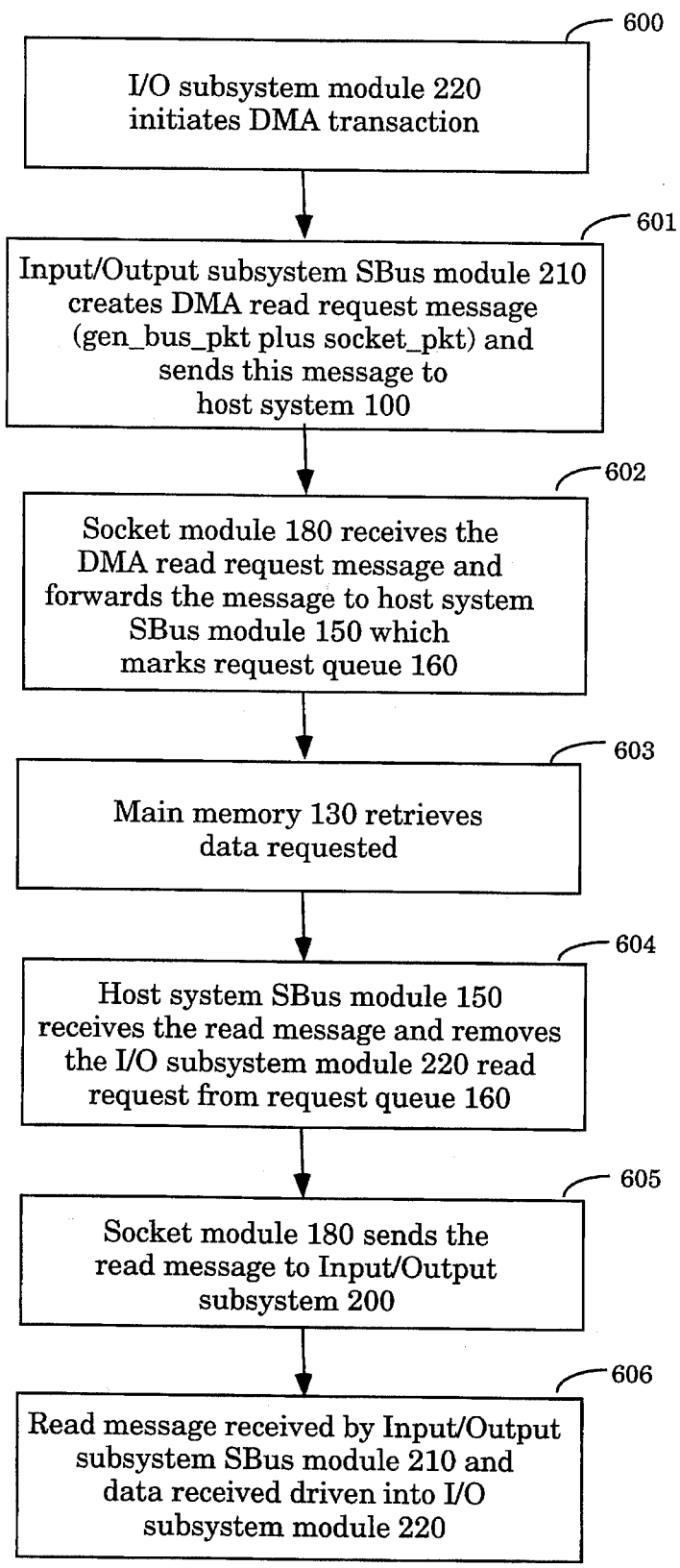
FIG. 5 is a flow chart of DMA read events of the simulation of FIG. 2.

FIG. 5 is a flow chart of a DMA read operation initiated by I/O subsystem 200. In block 600, I/O subsystem module 220 initiates a DMA read transaction by asserting a request line in I/O subsystem SBus module 210. I/O subsystem SBus control interface of the logic level simulator SBus module 210 arbitrates and grants the bus to I/O subsystem module 220. I/O subsystem SBus SBus interface 218 then responds to the master's request and PLI task 213 of I/O subsystem SBus module 210 passes the transaction information to socket interface 215. In block 601, PLI task 213 of I/O subsystem SBus module 210 packs the information into a transaction message, a gen_bus_pkt, and creates a socket_pkt which carries all the necessary information required for the DMA read cycle request. This message is then sent to host system 100 through IPC 190. I/O subsystem SBus clock continues running while I/O subsystem SBus interface 218 waits for the data requested.

In block 602, socket module 180 forwards the read message to host system SBus module 150 which in turn forwards the read message to MBus/SBus interface 140 and marks request queue 160 indicating that I/O subsystem module 220 owns slot 170, and slot 170 cannot be accessed until I/O subsystem module 220 read transaction is completed. MBus/SBus interface 140 sends the read message to MBus module 120 which in turn forwards the read message to main memory 130.

In block 603, main memory 130 reads the data at the address in main memory 130 as indicated in the information contained in the gen_bus_pkt of the read message. Main memory 130 appends the data retrieved to the read message and sets a good acknowledgment flag in the message and forwards the message to MBus module 120. In block 604, MBus module 120 forwards the read message to MBus/SBus interface 140 which in turn forwards the message to host system SBus module 150. Finally, host system SBus module 150 forwards this read message to socket module 180 and removes the I/O subsystem module 220 read request from request queue 160.

In block 605, upon receiving the read message, socket module 180 adds a socket_pkt to the gen_bus_pkt to produce a master/slave message and sends the message to I/O subsystem 200. In block 606, SBus interface 218 of I/O subsystem SBus module 210 receives the message and completes the DMA read cycle by driving the data and acknowledgment to I/O subsystem module 220. A DMA write cycle is completed the same way as the afore-described DMA read cycle, and upon completion of a DMA write cycle, I/O subsystem module 220 receives a return message with a good acknowledgment flag.

Figure 6:
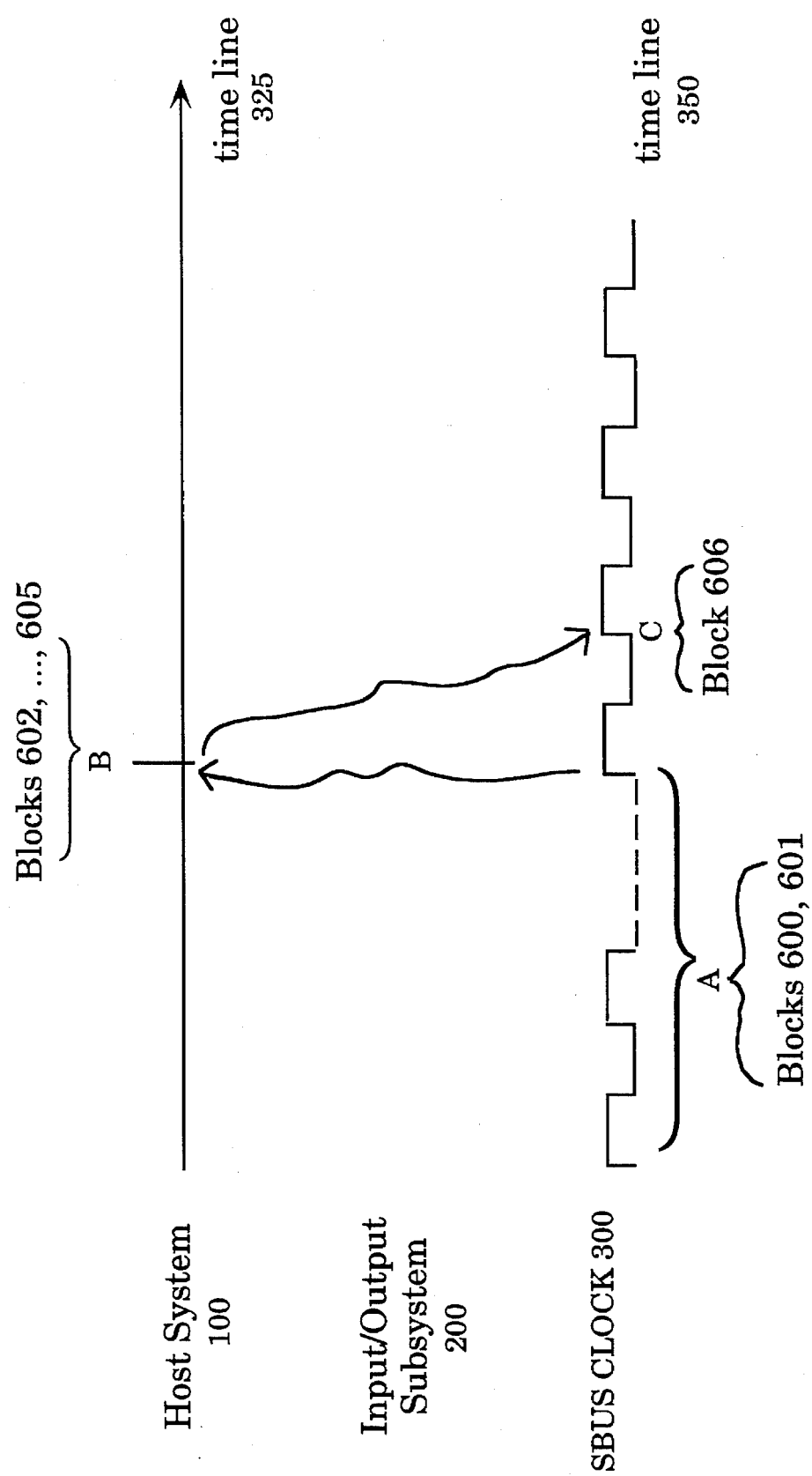
FIG. 6 is a timing diagram depicting DMA read events for the simulation of FIG. 2.

FIG. 6 is a timing diagram depicting the afore-described DMA read events. During time A, I/O subsystem 220 of I/O subsystem 200 initiates a DMA read transaction and socket interface 215 of I/O subsystem SBus module 210 sends a read message to host system 100. At time B, socket module 180 of host system 100 receives the read message and forwards the read message to host system SBus module 150 and the socket module 180 eventually retrieves the return read message. At point C, socket interface 215 of I/O subsystem SBus module 210 receives the read message which is returned from host system 100.

In an interrupt operation initiated by I/O subsystem 200, I/O subsystem SBus module 210 detects an interrupt line being asserted and sends an interrupt message to host system 100. The interrupt message comprises a socket_pkt and a gen_int_pkt. Socket module 180 then forwards the gen_int_pkt to interrupt controller module 185 and informs interrupt controller module 185 that a specified interrupt level is asserted. When I/O subsystem SBus module 210 detects an interrupt line being cleared, an interrupt message is sent to clear the interrupt line in interrupt controller module 185.

Figure 7:
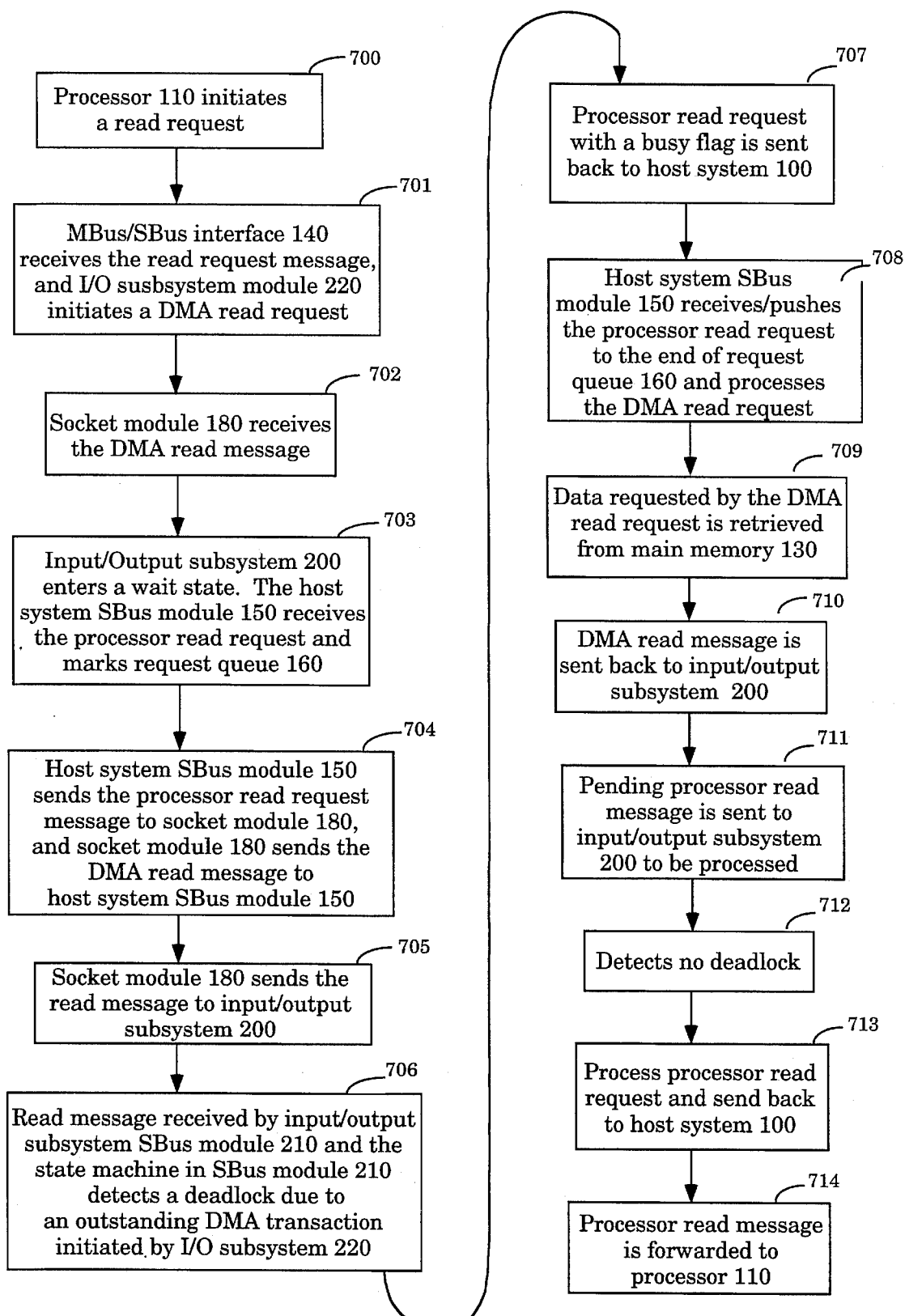
FIG. 7 is a flow chart of processor input/output and DMA read events and their interaction with each other for the simulation of FIG. 2.

FIG. 7 is a flow chart of a scenario where both a master/slave read request and a DMA read request are concurrently made. In block 700, processor 110 sends a processor read request message to MBus module 120 and MBus module 120 in turn forwards the processor read request message to the MBus/SBus interface 140. In block 701, MBus/SBus interface 140 receives the processor read request message and forwards the processor read request message to host system SBus module 150. Concurrently, I/O subsystem module 220 initiates a DMA read transaction and generates a DMA request by asserting proper I/O subsystem SBus signal. SBus interface 218, PLI task 213 and socket interface 215 in I/O subsystem SBus module 210 processes the DMA request and sends a DMA read request message to host system 100.

In block 702, socket module 180 receives the DMA read request message. In block 703, I/O subsystem 200 then enters a waiting state while it waits for a DMA return message from host system 100. Meanwhile in block 703, host system SBus module 150 receives the processor read request message sent by processor 110 and host system SBus module 150 marks the request queue 160 to indicate that the processor read request is accessing the device in slot 170.

In block 704, host system SBus module 150 forwards the processor read request message to socket module 180 and socket module 180 forwards the DMA read request message to host system SBus module 150. In block 705, upon receiving the DMA read request message, the host system SBus module 150 pushes the DMA read request message at the end of request queue 160 since slot 170 is already owned by processor 110.

Meanwhile, in block 706, socket interface 215 of I/O subsystem SBus module 210 receives the processor read request message from host system 100 and detects a deadlock. In block 707, socket interface 215 of I/O subsystem SBus module 210 sets a busy flag in the processor read request message and sends the processor read request message back to host system 100.

In block 708, socket module 180 of host system 100 receives the processor read request message from I/O subsystem 200 and forwards the processor read request message to host system SBus module 150. Upon receiving the processor read request message, host system SBus module 150 detects the busy flag in the processor read request message and pushes the processor read request to the end of request queue 160 and unmarks slot 170 owned by processor 110. Host system SBus module 150 then processes the DMA read request and marks request queue 160 to indicate that I/O subsystem module 220 owns slot 170 and forwards the DMA read request message to MBus/SBus interface 140.

MBus/SBus interface 140 sends the DMA read request message to MBus module 120 and MBus module 120 in turn forwards the DMA read request message to main memory 130. In block 709, main memory 130 reads the data at the address location of main memory 130 as indicated in the DMA read request message and appends that data to the DMA read request message and sets a good acknowledgment flag in the message. Main memory 130 then returns the processed DMA read request message to MBus module 120 which forwards the return DMA read request message to MBus/SBus interface 140 which in turn forwards the DMA read message to host system SBus module 150. Upon receiving the return DMA read message, host system SBus module 150 forwards the return DMA read message to socket module 180 and removes I/O subsystem module 220's DMA read request from request queue 160.

In block 710, socket module 180 receives the return DMA read request message and sends the return DMA read request message to I/O subsystem 200. At this time, socket interface 215 of I/O subsystem SBus module 210 receives the return DMA read request message from host system 100 and passes the data contained in the return DMA read request message to the simulation. Meanwhile in block 711, host system SBus module 150 processes the pending processor read request message and request queue 160 is marked to indicate that the processor read request is accessing the device in slot 170 and host system SBus module 150 forwards the processor read request message to socket module 180. Upon receiving the processor read request message socket module 180 sends the processor read request message to I/O subsystem 200. Socket interface 215 of I/O subsystem SBus module 210 receives the processor read request message and checks for a deadlock.

In block 712, upon detecting that there is no deadlock, socket interface 215 sends the processor read request message to I/O subsystem module 220 and a read is completed. In block 713, socket interface 215 appends the data read from I/O subsystem module 220 to the processor read request message and sets a good acknowledgment flag in the processor read request message. Socket interface 215 then sends the return processor read request message back to host system 100.

In block 714, socket module 180 receives the return processor read request message from I/O subsystem 200 and forwards the message to host system SBus module 150 which removes the processor read request from request queue 160 and forwards the message to MBus/SBus interface 140. MBus/SBus interface 140 in turn forwards the message to MBus module 120. Finally, MBus module 120 forwards the return processor read request message to processor 110 and a processor read access is completed. A concurrent master/slave write request and DMA write request are performed in the same way as the afore-described read requests and a return processor write request message and a return DMA write request message are returned with a good acknowledgment flag.

Figure 8:
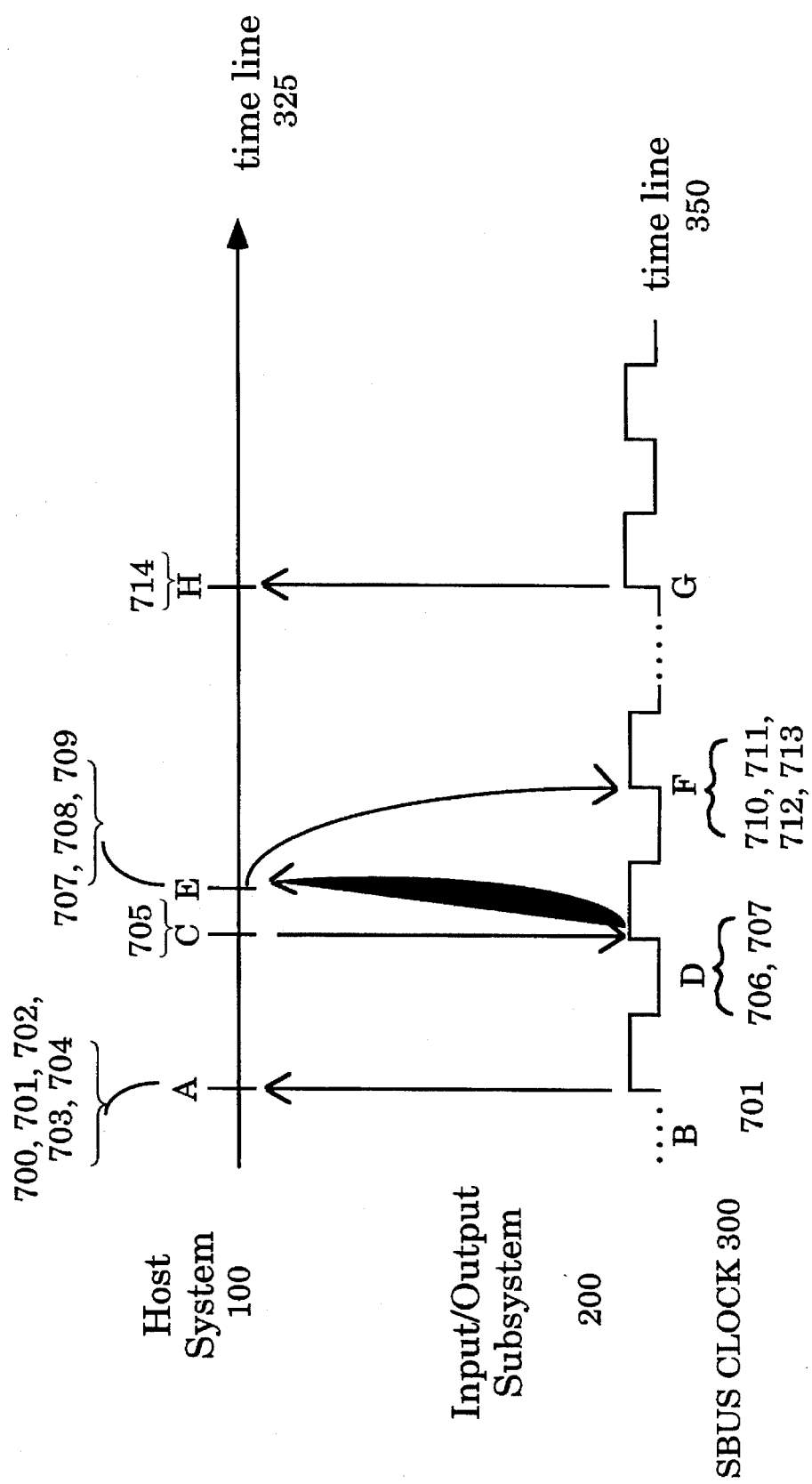
FIG. 8 is a timing diagram depicting processor input/output and DMA read events and their interaction with each other for the simulation of FIG. 2.

FIG. 8 is a timing diagram depicting the processor read events as well as the DMA read events occurring within the same time frame. Up until time B, I/O subsystem 200 remains in an idle state. Meanwhile at time A, processor 110 of host system 100 sends a process read request message to MBus module 120 which forwards the message to MBus/SBus interface 140. MBus/SBus interface module 140 forwards the message to host system SBus module 150. Meanwhile at time B, input/output subsystem module 220 of I/O subsystem 200 initiates a DMA read transaction and DMA read request message is transmitted to host system 100. At this point, I/O subsystem 200 enters a waiting state to wait for a return message from host system 100.

Back at time A, socket module 180 of host system 100 receives the DMA read request message. Meanwhile, host system SBus module 150 receives the processor read request message and marks request queue 160 to indicate that a processor read request is accessing the device in slot 170. The processor read request message ms then forwarded to socket module 180 which in turn forwards the DMA read request message to host system SBus module 150. At time C, host system SBus module 150 receives the DMA read request message and detecting that slot 170 is owned by processor 110, places the DMA read request at the end of request queue 160. Socket module 180 then forwards the processor read request message to I/O subsystem 200. At time D, socket interface 215 of I/O subsystem SBus module 210 receives the processor read request message, detects the deadlock and sets a busy flag in the processor read request message and sends the processor read request message back to host system 100. I/O subsystem 200 then enters into a waiting state as it waits for a return message regarding the DMA read request message which it has sent.

At time E, socket module 180 of host system 100 receives the processor read request message from I/O subsystem 200 and forwards that message to host system SBus module 150. Host system SBus module 150 detects the busy flag in the processor read request message and pushes the processor read request to the end of request queue 160 and unmarks slot 170 owned by processor 110. Host system SBus module 150 then processed the DMA read request, marks request queue 160 to indicate that I/O subsystem module 220 owns the device in slot 170. A DMA read message is then forwarded to main memory 130 via MBus/SBus interface 140 and MBus module 120. The main memory 130 reads the data requested and appends the data requested to the DMA read request message and sets a good acknowledgment flag in the DMA read request message and returns the DMA read request message to host system SBus module 150 via MBus module 120 and MBus/SBus interface module 140. Upon receiving the return DMA read request message, host system SBus module 150 removes I/O subsystem module 220's DMA request from request queue 160. Socket interface 215 of I/O subsystem SBus module 220 receives the return DMA read request message returned from host system 100 and passes the data to I/O subsystem module 220. Still in time E, host system SBus module 150 processes the pending processor read request message and request queue 160 is marked to indicate that the processor read request is accessing the device in slot 170 and host system SBus module 150 forwards the processor read message to socket module 180 which in turn forwards the processor read message to I/O subsystem 200 at which point host system 100 enters a wait state while it waits for a return read message from I/O subsystem 200 regarding the processor read request.

At time F and G, socket interface 215 of I/O subsystem SBus module 220 receives the processor read request message from host system 100 and checks for a deadlock situation. Upon finding no deadlock, I/O subsystem SBus module forwards the processor read request message to I/O subsystem module 220. When the read is completed, socket interface 215 of I/O subsystem SBus module 210 appends the data read to the processor read request message and sets a good acknowledgment flag in the processor read request message and transmits the return processor read request message back to host system 100. At this point, I/O subsystem 200 returns to an idle state.

Finally both the DMA and processor read requests are completed at time H. Socket module 180 receives the return processor read request message back from I/O subsystem 200 and forwards the processor read request message to host system SBus module 150 which removes the processor read request from the request queue 160 and forwards the message back to processor 110 via MBus/SBus interface module 140 and MBus module 120.

The present invention may be used to test an I/O subsystem simulated by Verilog XL® and to test a diagnostic program running on a host system simulated by MPSAS®. An example I/O subsystem which may be tested is composed of a quad ethernet controller (QEC), a transmit/receive device which transmits and receives ethernet packets, and a buffer for incoming and outgoing ethernet packets. This simulated I/O subsystem may be tested by a loop back test running on a simulated host system. The loop back test will be described with references being made to components from FIG. 2.

In a loop back test QEC moves the contents of a transmit buffer in main memory 130 in the form of a ethernet packet (write request message) to I/O subsystem 220's receive buffer. This process is performed through the afore-described slave access. QEC then informs the transmit/receive device to transmit the ethernet packet to main memory 130. This process is performed through the afore-described DMA access. At the completion of a loop back test, the contents in the transmit and receive buffers of main memory 130 are compared. If the contents of the transmit buffer and receive buffer are the same, the simulated I/O subsystem passes the loop back test. Otherwise, the loop back test indicates a problem in the I/O subsystem and/or the diagnostic program running on the simulated host system.

What has been described is an integration of an instruction level simulation with a logic level simulation for an integrated system level simulation for testing. In addition, the integrated system level simulation resolves the potential deadlock situation and the synchronization problem between an instruction level simulation and a logic level simulation.

While certain exemplary embodiments have been described in detail and shown in the accompanying drawings, it is to be understood that such embodiments are merely illustrative of and not restrictive on the broad invention, and that this invention is not limited to the specific arrangements and constructions shown and described, since various other modifications may occur to those ordinarily skilled in the art.

What is claimed is:

1. A method for providing a system level simulation of a system having an input/output subsystem and a host system, said simulation of said system being capable of implementing a two-way communication between simulation of said input/output subsystem and said host system, and resolving potential deadlock situations comprising the steps of:

simulating an input/output subsystem using a logic level simulator, said simulated input/output subsystem being capable of a direct memory access;

concurrently simulating a host system with said simulating of said input/output subsystem, said simulating said host system being performed using an instruction level simulator with signals transmitted between said simulated input/output subsystem and said simulated host system, said simulated host system being capable of both processor read/write access and direct memory access; and resolving deadlocks between said simulated input/output subsystem and said simulated host system, said deadlock may occur during said two-way communication between said simulated host system and said simulated input/output subsystem when said simulated input/output subsystem performs a direct memory access at the same time as when said simulated host system performs a processor read/write access, causing said simulated input/output subsystem and said simulated host system to wait for data and an acknowledgment from each other at the same time, said resolving being performed by deferring said processor read/write access, an said two-way communication occurring through a simulated interprocess communication.

2. The method of claim 1 further comprising the step of simulating a read/write data event between said simulated input/output subsystem and said simulated host system through direct memory access, said direct memory access being initiated by said simulated input/output subsystem to access main memory of said simulated host system, said direct memory access being simulated concurrently with a processor read/write access being performed by said simulated host system.

3. The method of claim 1 further comprising the step of simulating a read/write data event between said simulated input/output subsystem and said simulated host system through a processor read/write access, said simulated host system initiating said processor read/write access to access said simulated input/output subsystem, said processor read/write access being simulated concurrently with said direct memory access.

4. The method of claim 3 wherein said step of simulating a read/write data event between said simulated input/output subsystem and said simulated host system through a processor read/write access further comprises the steps of:

sending a processor read/write request message to said simulated input/output subsystem;

processing said processor read/write request message within said simulated input/output subsystem; and sending a processed processor read/write request message to said processor.

5. The method of claim 4 wherein said step of sending a processor read/write request message to said simulated input/output subsystem further comprises the steps of:

generating said processor read/write request message from said processor;

sending said processor read/write request message from said processor to a MBus module;

sending said read/write request message from said MBus module to a MBus/SBus interface module;

sending said processor read/write request message from said MBus/SBus interface module to a host system SBus module;

sending said processor read/write request message from said host system SBus module to a socket module; and sending said processor read/write request message from said socket module to said simulated input/output subsystem.

6. The method of claim 5 wherein said step of sending said processor read/write request message from said host system SBus module to a socket module further comprises the step of marking a request queue to indicate that a processor read/write request is accessing a device in a slot in said host system SBus module.

7. The method of claim 4 wherein said step of processing said processor read/write request message further comprises the step of checking for deadlock.

8. The method of claim 7 wherein said step of checking for deadlock further comprises the step of sending said processor read/write request message to said simulated input/output subsystem if a deadlock is not detected.

9. The method of claim 8 further comprising the steps of:

reading data requested by said processor read/write request message for a read cycle;

appending the data read to said processor read request message and setting a good acknowledgment flag in said processor read/write request message for a read cycle and writing data provided by said processor read/write request message for a write cycle; and setting a good acknowledgment flag in said processor read/write request message for a write cycle.

10. The method of claim 7 wherein said step of checking for deadlock further comprises the step of setting a busy flag in said processor read/write request message if a deadlock is detected.

11. The method of claim 10 wherein said step of setting a busy flag further comprises the steps of:

sending said processor read/write request message with said busy flag to said socket module;

sending said processor read/write request message with said busy flag from said socket module to said host system SBus module;

detecting said busy flag of said processor read/write request message, placing said processor read/write request message to the end of said request queue and unmarking said slot owned by said processor read/write request message;

marking said request queue to indicate that a direct memory access read/write request message owns said slot;

marking said request queue to indicate that said processor read/write request message owns said slot after said direct memory access read/write request message is processed.

12. The method of claim 4 wherein said step of sending a processed processor read/write request message to said processor further comprises the steps of:

sending said processor read/write request message from said socket module to said host system SBus module;

sending said processor read/write request message from said host system SBus module to said MBus/SBus interface module;

sending said processor read/write request message from said MBus/SBus interface module to said MBus module; and sending said processor read/write request message from said MBus module to said processor.

13. The method of claim 8 wherein said step of sending said processor read/write request message from said socket module to said SBus module further comprises the step of removing said processor read/write request from said request queue.

14. The method of claim 2 wherein said step of simulating a read/write data through a direct memory access further comprises the steps of:

sending a direct memory access read/write request to said simulated host system;

reading data requested by said direct memory access read/write request message from a main memory for a read cycle and writing data provided by said direct memory access read/write request message to said main memory; and sending a processed direct memory access read/write request message to said simulated input/output subsystem.

15. The method of claim 14 wherein said step of sending a direct memory access read/write request further comprises the steps of:

generating said direct memory access read/write request from said simulated input/output subsystem;

sending said direct memory access read/write request from said simulated input/output subsystem to an input/output subsystem SBus module; and sending said direct memory access read/write request from said input/output subsystem SBus module to said socket module of said simulated host system.

16. The method of claim 14 wherein said step of reading data requested by said direct memory access read/write request message for a read cycle and writing data provided by said direct memory access read/write request message to said main memory for a write cycle further comprises the steps of:

receiving said direct memory access read/write request from said input/output subsystem SBus module sending said direct memory access read/write request from said socket module to said host system SBus module;

sending said direct memory access read/write request from said host system SBus module to said MBus/SBus interface module;

sending said direct memory access read/write request from said MBus/SBus interface module to said MBus module;

sending said direct memory access read/write request from said MBus module to said main memory; and reading data requested by said direct memory access read/write request message from said main memory for a read cycle and writing data provided by said direct memory access read/write request to said main memory, appending said data read to said direct memory access read request message for a read cycle and setting a good acknowledgment flag in said direct memory access read/write request message for both read and write cycles to produce a processed direct memory access read/write request message.

17. The method of claim 14 wherein said step of sending a processed direct memory access read/write request message further comprises the steps of:

sending said processed direct memory access read/write request message from said main memory to said MBus module;

sending said processed direct memory access read/write request message from said MBus module to said MBus/SBus interface module;

sending said processed direct memory access read/write request message from said MBus/SBus interface module to said host system SBus module;

removing said direct memory access read/write request from said request queue;

sending said processed direct memory access read/write request message from said host system SBus module to said socket module; and sending said processed direct memory access read/write request message from said socket module to said input/output subsystem SBus module.

18. An apparatus for providing a system level simulation of a system for testing of said system, said system having a simulated input/output subsystem and a simulated host system, said simulation of said system being capable of implementing a two-way communication between said simulated input/output subsystem and said a logic level simulator simulating said input/output subsystem, said simulated input/output subsystem being capable of direct memory access; and an instruction level simulator concurrently simulating a host system while said input/output subsystem is being simulated by said logic level simulator wherein said simulated input/output subsystem and said simulated host system communicate with each other through a simulated interprocess communication, said simulated host system being capable of processor read/write access to access said simulated input/output subsystem, deadlock between said simulated host system and said simulated input/output subsystem being resolved by deferring said processor read/write access, and said two-way communication occurring through a simulated interprocess communication, said deadlock may occur during said two-way communication between said simulated host system and said simulated input/output subsystem when said simulated input/output subsystem performs a direct memory access at the same time as when said simulated host system performs a processor read/write access, causing said simulated input/output subsystem and said simulated host system to wait for data and an acknowledgment from each other at the same time.

* * * * *

UNITED STATES PATENT AND TRADEMARK OFFICE
CERTIFICATE OF CORRECTION

PATENT NO. : 5, 493, 672
DATED : February 20, 1996
INVENTOR(S) : Lau et al.

It is certified that errors appear in the above-identified patent and that said Letters Patent is hereby corrected as shown below:

In column 1 at line 40, please delete " simulated is a slave device. Further, direct memory access system level simulation assumes that the hardware being (DMA) is not supported by such prior art." and insert -- system level simulation assumes that the hardware being simulated is a slave device. Further, direct memory access (DMA) is not supported by such prior art. --

In column 1 at line 61, please delete " as high " and insert -- as the high --.

In column 7 at line 65, please delete " message " and insert -- message, --.

In column 8 at line 45, please delete " ms " and insert -- is --.

In column 8 at line 67, please delete " processed " and insert -- processes --.

In column 9 at line 56, please delete " test " and insert -- test, --.

In column 10 at line 47, please delete " an " and insert -- and --.

Signed and Sealed this

Twenty-second Day of October, 1996

*Attest:*

BRUCE LEHMAN

*Attesting Officer*     *Commissioner of Patents and Trademarks*